United States Patent
Fan et al.

(10) Patent No.: US 10,868,149 B2
(45) Date of Patent: Dec. 15, 2020

(54) SOURCE AND DRAIN SURFACE TREATMENT FOR MULTI-GATE FIELD EFFECT TRANSISTORS

(71) Applicant: Taiwan Semiconductor Manufacturing Co., Ltd., Hsin-Chu (TW)

(72) Inventors: Wei-Han Fan, Hsin-Chu (TW); Wei-Yuan Lu, Taipei (TW); Yu-Lin Yang, Hsinchu County (TW); Chun-Hsiang Fan, Hsinchu (TW); Sai-Hooi Yeong, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/600,904

(22) Filed: Oct. 14, 2019

(65) Prior Publication Data
US 2020/0044062 A1    Feb. 6, 2020

Related U.S. Application Data

(62) Division of application No. 15/964,398, filed on Apr. 27, 2018, now Pat. No. 10,446,669.
(Continued)

(51) Int. Cl.
*H01L 29/66* (2006.01)
*H01L 29/08* (2006.01)
(Continued)

(52) U.S. Cl.
CPC .. *H01L 29/66795* (2013.01); *H01L 21/02123* (2013.01); *H01L 21/2254* (2013.01); *H01L 21/26533* (2013.01); *H01L 21/3065* (2013.01); *H01L 21/30604* (2013.01); *H01L 21/30655* (2013.01); *H01L 21/31116* (2013.01); *H01L 29/0847* (2013.01); *H01L 29/6653* (2013.01); *H01L 29/785* (2013.01); *H01L 29/7848* (2013.01); *H01L 21/02236* (2013.01); *H01L 21/02255* (2013.01); *H01L 29/66545* (2013.01)

(58) Field of Classification Search
None
See application file for complete search history.

(56) References Cited

U.S. PATENT DOCUMENTS 8,729,634 B2 * 5/2014 Shen .................... H01L 29/7853
257/368
8,836,016 B2 9/2014 Wu et al.
(Continued)

*Primary Examiner* — J. E. Schoenholtz
(74) *Attorney, Agent, or Firm* — Haynes and Boone, LLP

(57) ABSTRACT

A method includes providing a structure having a substrate and a fin extending from the substrate, wherein the fin includes a first semiconductor material and has a source region, a channel region, and a drain region for a transistor; forming a gate stack over the channel region; performing a surface treatment to the fin in the source and drain regions, thereby converting an outer portion of the fin in the source and drain regions into a different material other than the first semiconductor material; etching the converted outer portion of the fin in the source and drain regions, thereby reducing a width of the fin in the source and drain regions; and depositing an epitaxial layer over the fin in the source and drain regions.

20 Claims, 11 Drawing Sheets

Related U.S. Application Data

(60) Provisional application No. 62/593,001, filed on Nov. 30, 2017.

(51) Int. Cl.
| | | |
|---|---|---|
| *H01L 21/02* | (2006.01) | |
| *H01L 21/265* | (2006.01) | |
| *H01L 21/3065* | (2006.01) | |
| *H01L 29/78* | (2006.01) | |
| *H01L 21/225* | (2006.01) | |
| *H01L 21/311* | (2006.01) | |
| *H01L 21/306* | (2006.01) | |

(56) References Cited

U.S. PATENT DOCUMENTS

| | | |
|---|---|---|
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 9,837,405 B1 | 12/2017 | Cheng |
| 2009/0283806 A1* | 11/2009 | Yang ............... H01L 29/7834 257/288 |
| 2011/0079829 A1 | 4/2011 | Lai et al. |
| 2011/0193178 A1 | 8/2011 | Chang et al. |
| 2013/0187109 A1* | 7/2013 | Tan ............... H01L 29/42332 257/2 |
| 2014/0159142 A1* | 6/2014 | Lim ............... H01L 29/42364 257/330 |
| 2016/0099313 A1 | 4/2016 | Tai et al. |
| 2016/0329416 A1 | 11/2016 | Huang et al. |
| 2016/0351715 A1* | 12/2016 | Jung ............... H01L 29/0847 |
| 2017/0053912 A1* | 2/2017 | Ching ............... H01L 21/764 |
| 2018/0190772 A1* | 7/2018 | Min ............... H01L 29/0649 |
| 2018/0218947 A1* | 8/2018 | Xie ............... H01L 21/823431 |
| 2018/0337243 A1* | 11/2018 | Li ............... H01L 21/823462 |
| 2019/0165139 A1 | 5/2019 | Fan et al. |

\* cited by examiner

SOURCE AND DRAIN SURFACE TREATMENT FOR MULTI-GATE FIELD EFFECT TRANSISTORS

PRIORITY

This application is a divisional application of U.S. patent application Ser. No. 15/964,398, filed on Apr. 27, 2018, which claims priority to U.S. Provisional Patent Application Ser. No. 62/593,001 filed on Nov. 30, 2017, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). Examples of the multi-gate devices include double-gate FET, triple-gate FET, FinFET, omega-gate FET, and gate-all-around (or surround-gate) FET. The multi-gate FETs are expected to scale the semiconductor process technology beyond the limitations of the conventional bulk metal-oxide-semiconductor FET (MOSFET) technology. However, as the transistor structure scales down and becomes three dimensional, the quality of the transistor source and drain epitaxial structure exhibits increased impact on the device performance. Although existing approaches in source and train epitaxial structure formation have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
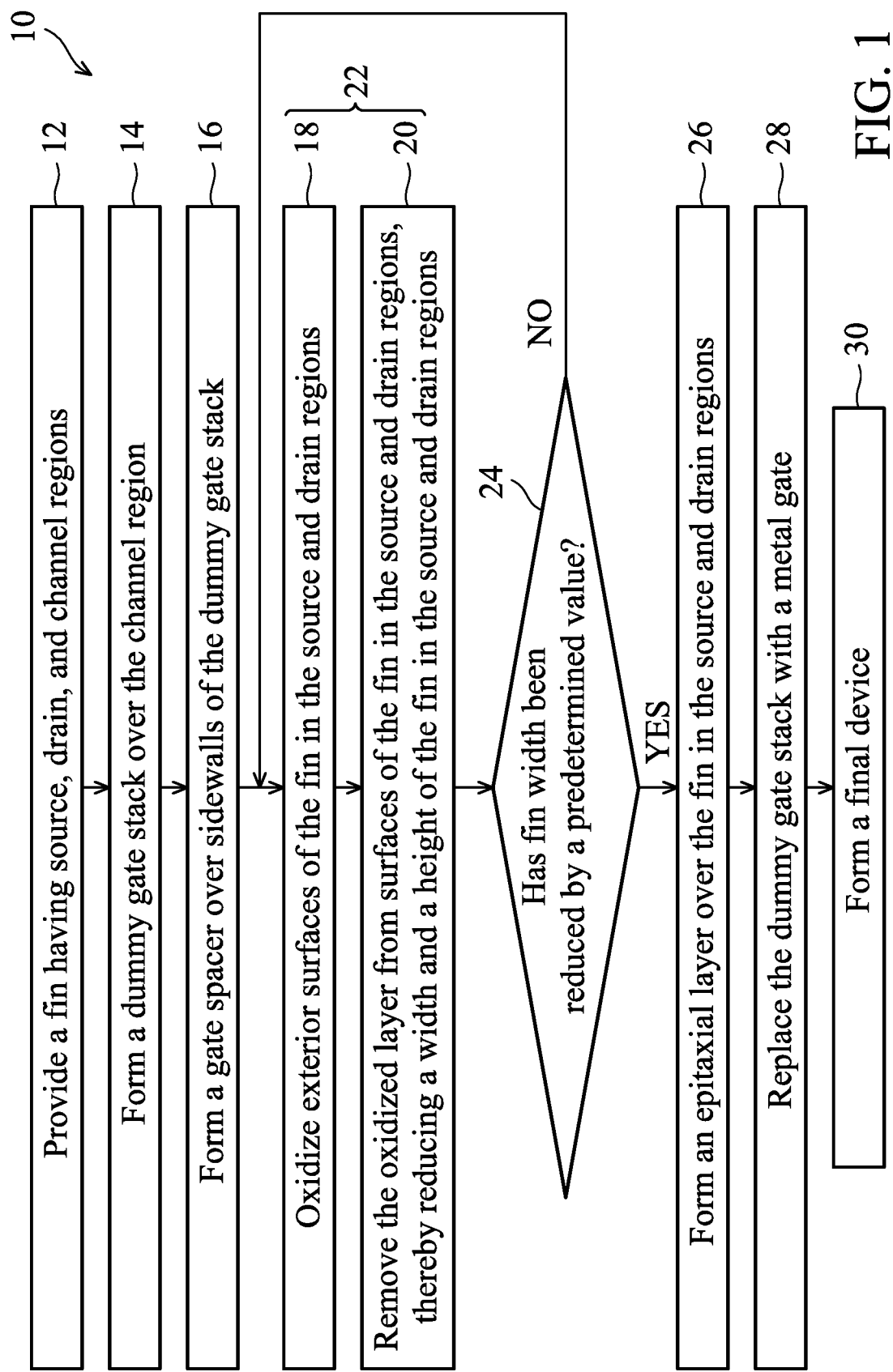
FIG. 1 shows a flow chart of a method of fabricating a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to semiconductor devices having multi-gate FETs that include source and drain (S/D) features. Examples of the multi-gate FETs include double-gate FETs, triple-gate FETs, FinFETs, omega-gate FETs, and gate-all-around (GAA) FETs. Furthermore, the GAA FETs may include one or more of the nanowire channel, the bar-shaped channel, or other suitable channel structures. An object of the present disclosure is to provide a novel structure of S/D features for the multi-gate transistors so as to maintain transistor channel strain, accelerate dopant diffusion between S/D features and channel regions, and improve epitaxial S/D feature quality. In embodiments, a semiconductor fin in the S/D regions underlying epitaxial S/D features is trimmed smaller than its portions in the channel region. In other words, the epitaxial S/D features cover at least a top surface and two sidewall surfaces of the underlying fin, while keeping in direct contact with part of the semiconductor fin in the channel region. Such structure provides a direct path for dopant to directly flow from the S/D features into the channel region, thereby improving dopant diffusion efficiency. Further, the trimmed semiconductor fin maintains fin strain strength in the channel region and improves quality of the S/D features epitaxially grown above.

FIG. 1 shows a flow chart of a method 10 of forming a multi-gate semiconductor device, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-10. FIGS. 1-5 and 8-10 show perspective views of the device 100 during various stages of fabrication according to aspects of the present disclosure. FIGS. 6A-7D show cross sectional views of portions of the device 100 along either the A-A' or B-B' line of FIG. 5 according to various embodiments.

Figure 2:
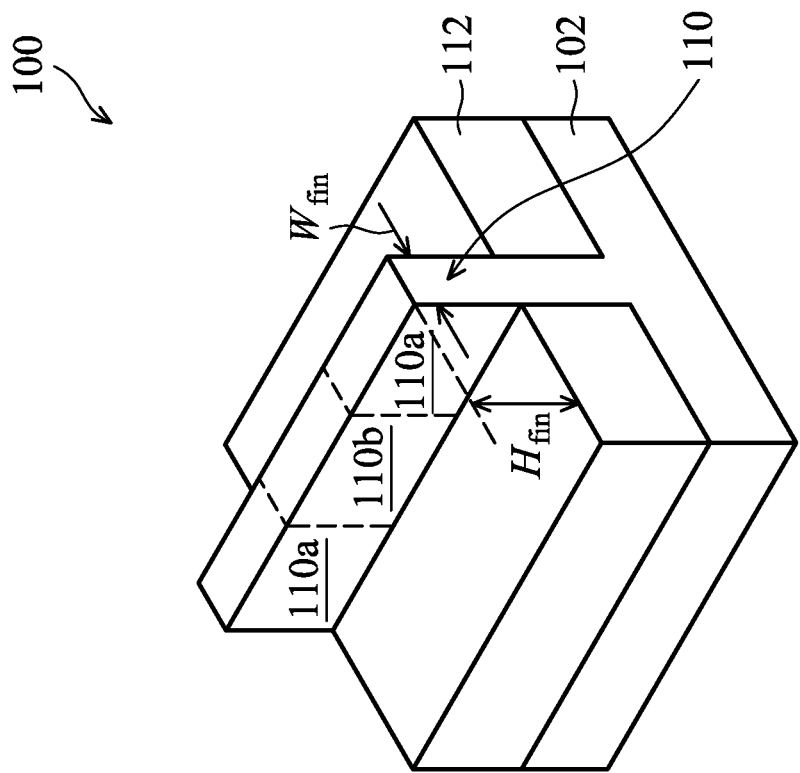
FIGS. 2, 3, 4, 5, 6A, 6B, 7A, 7B, 7C, 7D, 8, 9, and 10 are perspective and cross-sectional views of forming a semiconductor device according to the method of FIG. 1, in accordance with some embodiments.

At operation 12, the method 10 (FIG. 1) receives a device 100 as shown in FIG. 2. Referring to FIG. 2, the device 100 includes a substrate 102 and a fin 110 projecting upwardly (along the "z" direction) from the substrate 102. In various embodiments, the device 100 may have multiple fins 110. The device 100 in FIG. 2 is provided for illustration purposes and does not necessarily limit the embodiments of the present disclosure to any number of fins 110. The fin 110 is isolated by an isolation structure 112 that is disposed over the substrate 102. While the illustrated embodiments include FinFET devices, further embodiments include other raised active and passive devices formed upon the substrate 102. To that extent, the fin 110 is representative of any raised feature over the substrate 102.

The substrate 102, in various examples, includes an elementary (single element) semiconductor, such as silicon or germanium in a crystalline structure; a compound semiconductor, such as silicon germanium, silicon carbide, gallium arsenide, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. The substrate 102 may be uniform in composition or may include various layers, some of which may be selectively etched to form the fins. The layers may have similar or different compositions. In various embodiments, some substrate layers have non-uniform compositions to induce device strain in order to tune device performance. Examples of layered substrates include silicon-on-insulator (SOI) substrates. In some such examples, a layer of the substrate 102 may include an insulator such as a silicon oxide, a silicon nitride, a silicon oxynitride, a silicon carbide, and/or other suitable insulator materials.

The fin 110 may comprise at least a semiconductor material selected from the group consisting of silicon, silicon-germanium ($Si_{1-x}Ge_x$), germanium, and III-V compound semiconductors such as gallium arsenide, indium gallium arsenide ($In_mGa_{1-m}As$), indium arsenide, indium phosphide, and indium antimonide. The fin 110 may comprise strained $Si_{1-x}Ge_x$ formed on Si, or strained Si formed on relaxed silicon-germanium. In an embodiment, the fin 110 comprises strained $Si_{1-x}Ge_x$ and the substrate 102 comprises a relaxed or partially relaxed silicon germanium alloy $Si_{1-r}Ge_r$ layer, where the germanium mole fraction r is smaller than x. By selecting x to be larger than r, the natural lattice constant of the $Si_{1-x}Ge_x$ channel is larger than that of $Si_{1-r}Ge_r$, and the $Si_{1-x}Ge_x$ channel is under compressive stress or strain. In embodiments, the compressive strain in the channel in the longitudinal direction is larger than 0.5%, such as larger than 1%. In embodiments, the substrate 102 may also comprise a silicon oxide ($SiO_2$) layer (i.e. silicon-on-insulator substrate), and the fin 110 may be formed from a silicon-on-insulator wafer. In the illustrated embodiment, the fin sidewall surfaces are of (110) crystal orientation and the fin top surface is of (100) crystal orientation. The fin sidewall surfaces may be of other crystal orientations such as (551). Other configurations and shapes of the fin 110 are possible and are within the scope of the present disclosure.

The fin 110 may be fabricated using suitable processes including photolithography and etching processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fin 110 on the substrate 102. The etching process can include dry etching, wet etching, reactive ion etching (RIE), and/or other suitable processes. Alternatively, the fin 110 may be formed using mandrel-spacer double patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate and patterned using a photolithography process. Spacers are formed alongside the patterned sacrificial layer using a self-aligned process. The sacrificial layer is then removed, and the remaining spacers, or mandrels, may then be used to pattern the substrate 102 to form the fins. The fins may include one or more layers of epitaxially grown semiconductor materials in some embodiments. Numerous other embodiments of methods to form the fin 110 may be suitable.

Still referring to FIG. 2, the fin 110 includes two source/drain (S/D) regions 110a and a channel region 110b between the two S/D regions 110a. The S/D regions 110a and the channel region 110b are arranged horizontally along the "y" direction. In the illustrated embodiment, the fin 110 has a substantially rectangular profile in the "x-z" plane. The width of the fin 110 along the "x" direction is denoted as $W_{fin}$. The fin 110 has a height $H_{fin}$ above the isolation structure 112 along the "z" direction. In alternative embodiments, the fin 110 has a trapezoidal profile in the "x-z" plane, and the fin width $W_{fin}$ is measured at the middle ($H_{fin}/2$) of the fin 110. In embodiments, the fin width $W_{fin}$ may be 10 nanometers (nm) or smaller, such as 6 nm or smaller. In embodiments, the fin height $H_{fin}$ may be equal to or greater than 30 nm, such as 40 nm or greater, or even 50 nm.

In various embodiments, the device 100 includes multiple fins 110, where the fins 110 may comprise Si fins and $Si_{1-x}Ge_x$ fins. $Si_{1-x}Ge_x$ fins may be formed together with Si fins and $Si_{1-x}G_x$ fins may be adjacent to Si fins. Further, $Si_{1-x}Ge_x$ fins and Si fins need not have the same physical dimensions. The $Si_{1-x}Ge_x$ fins may be used for p-channel transistors, while the Si fins may be used for n-channel transistors. In embodiments, as the Si fins 110 are formed on a fully or partially relaxed $Si_{1-r}Ge_r$ layer in the substrate 102, the Si fins would be under tensile stress or strain in the longitudinal direction. The presence of tensile strain in the longitudinal direction increases the electron mobility in Si, and improves the drive current and speed performance of the n-channel Si transistors.

The isolation structure 112 may be formed of silicon oxide, silicon nitride, silicon oxynitride, fluoride-doped silicate glass (FSG), a low-k dielectric material, and/or other suitable insulating material. The isolation structure 112 may be shallow trench isolation (STI) features. In an embodiment, the isolation structures 112 is formed by etching trenches in the substrate 102, e.g., as part of the fin 110 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 112 may include a multi-layer structure, for example, having one or more thermal oxide liner layers.

Figure 3:
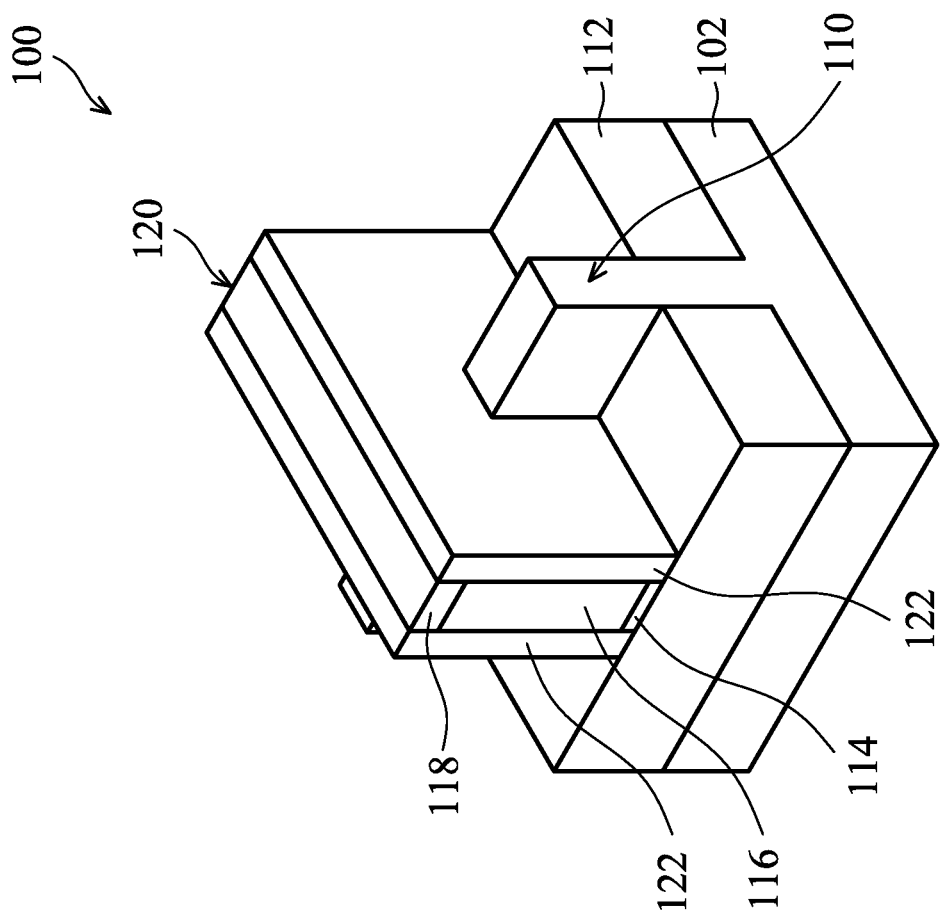
Figure 4:
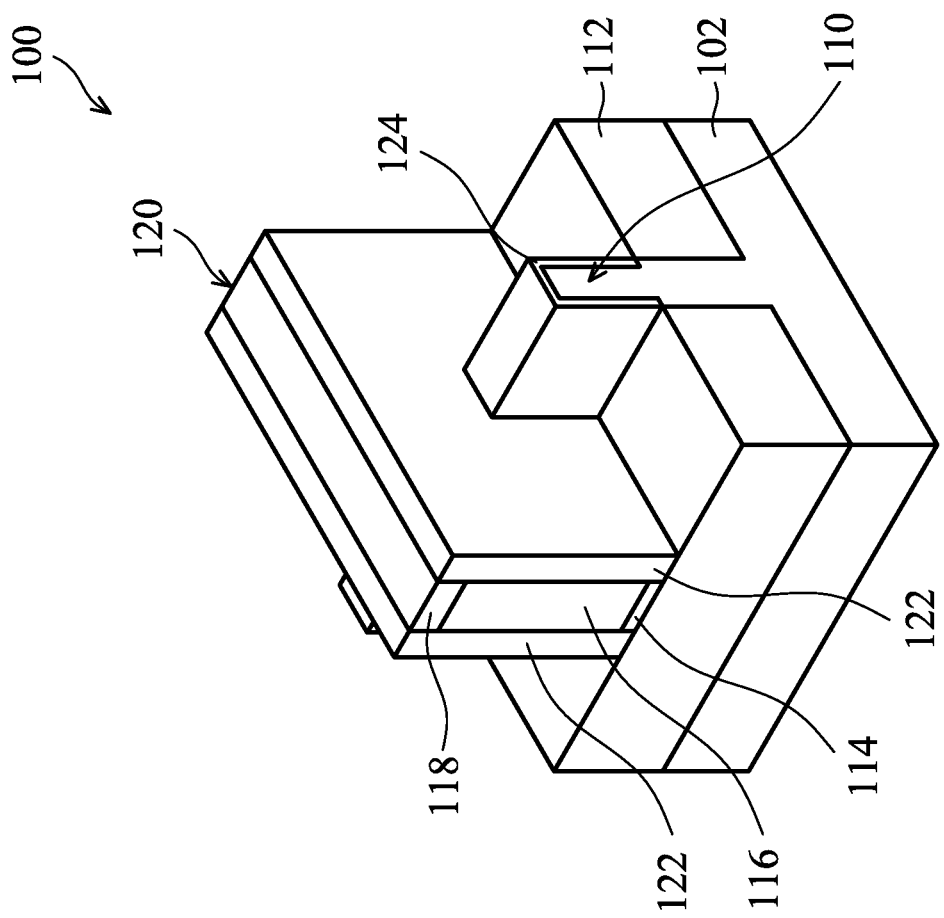

At operation 14, the method 10 (FIG. 1) forms a gate stack 120 over the fins 110, particularly, over the channel regions 110b (FIG. 3). In the illustrated embodiment, the gate stack 120 is a dummy gate stack and will be replaced by a final gate stack in a gate-last process. In some embodiments, the gate stack 120 is the final gate stack, e.g., in a gate-first process. The dummy gate stack 120 includes a dummy interfacial layer 114, a dummy gate electrode 116, and a hard mask layer 118. The dummy interfacial layer 114 may include a dielectric material such as silicon oxide (e.g., $SiO_2$) or silicon oxynitride (e.g., SiON), and may be formed by chemical oxidation, thermal oxidation, atomic layer deposition (ALD), chemical vapor deposition (CVD), and/or other suitable methods. The dummy gate electrode 116 may include poly-crystalline silicon (poly-Si) and may be formed by suitable deposition processes such as low-pressure chemical vapor deposition (LPCVD) and plasma-enhanced CVD (PECVD). The hard mask layer 118 may include one or more layers of material such as silicon oxide and/or silicon nitride. In embodiments, the dummy gate stack 120 may include other suitable layers. The various layers of the dummy gate stack 120 may be formed by photolithography and etching processes.

Still referring to FIG. 3, at operation 16, the method 10 (FIG. 1) forms a gate spacer 122 over sidewalls of the dummy gate stack 120. This may involve one or more deposition and etching processes. In one embodiment, a spacer is formed on the sidewalls of both the dummy gate stack 120 and the fin 110, and then it is removed from the sidewalls of the fin 110, leaving only the portion on the sidewalls of the dummy gate stack 120. As an example, a spacer material may be deposited as a blanket over the isolation structure 112, the fin 110, and the dummy gate stack 120. Then the spacer material is etched by an anisotropic etching process to expose the isolation structure 112, the hard mask layer 118, and a top surface of the fin 110. As a result, only portions of the spacer material on the sidewalls of the dummy gate stack 120 and the sidewalls of the fin 110 remain. The portion of the spacer material on the sidewalls of the dummy gate stack 120 is referred to as the gate spacer 122. In embodiments, the spacer material may comprise a dielectric material, such as silicon oxide, silicon nitride, silicon oxynitride, silicon carbide, other dielectric material, or combinations thereof. Furthermore, the gate spacer 122 may comprise one or multiple layers of material.

The portion of the spacer material on the sidewalls of the fin 110 is subsequently removed while the gate spacer 112 remains. In an embodiment, this is achieved by one or more treatment and etching processes. In a first step of this embodiment, the gate spacer 122 is selectively modified to have a different etch resistance than spacer material on the sidewalls of the fin 110. For example, this can be done by a directional ion implantation or plasma treatment in the presence of a directional ion beam so that the gate spacer 122 is more resistant to an etchant than the spacer material on the sidewalls of the fin 110. In a second step of this embodiment, the spacer material on the sidewalls of the fin 110 is substantially removed by a selective etching process while the gate spacer 122 substantially remains. The etching process exposes the sidewall surfaces of the fins 104. In embodiments, operation 16 further includes a cleaning process that cleans the surfaces of the fin 110 including the top and sidewall surfaces and prepares them for a subsequent trimming process. The various etching and cleaning processes above may recess the fin 110 slightly.

At operation 18, the method 10 (FIG. 2) converts an outer portion 124 of the fin 110 in the S/D regions 110a to a different material composition than the inner portion of the fin 110. The outer portion 124 may also be referred to as the exterior layer 124 of the fin 110. In some embodiments, operation 18 includes an oxidization process, which oxidizes the top and sidewall surfaces of the fin 110 in the S/D regions 110a. In alternative embodiments, the operation 18 includes an ion implantation (e.g. oxygen implant), which implants dopants into a thin layer beneath the exterior surfaces of the fin 110. In the illustrated embodiment, the fin 110 includes SiGe, and the operation 18 converts an exterior layer 124 of the fin 110 in the S/D regions 110a to SiGeO. The converted exterior layer 124 may have a thickness ranging from about 0.5 nm to about 2 nm. In some embodiments, the converted exterior layer 124 has a wider thickness around the center height of the fin 110 and narrower thickness near the top and bottom of the fin 110. In some examples, the oxidation process may be performed by exposing the device 100 to a wet oxidation process, a dry oxidation process, or a combination thereof. In one embodiment, the oxidation process includes oxygen ambient (e.g., ozone). In another embodiment, the thermal oxidation is conducted in a combination of steam ambient and oxygen ambient. As an example, the thermal oxidation to the device 100 is performed in a $H_2O$ reaction gas with a temperature ranging from about 400° C. to about 600° C. and under a pressure ranging from about 1 atm to about 20 atm. In the S/D regions 110a, the operation 18 causes the exterior layer 124 and the inner portion of the fin 110 to exhibit different etching selectivity upon a selected etchant, which allows the exterior layer 124 to be removed in subsequent operations.

Figure 5:
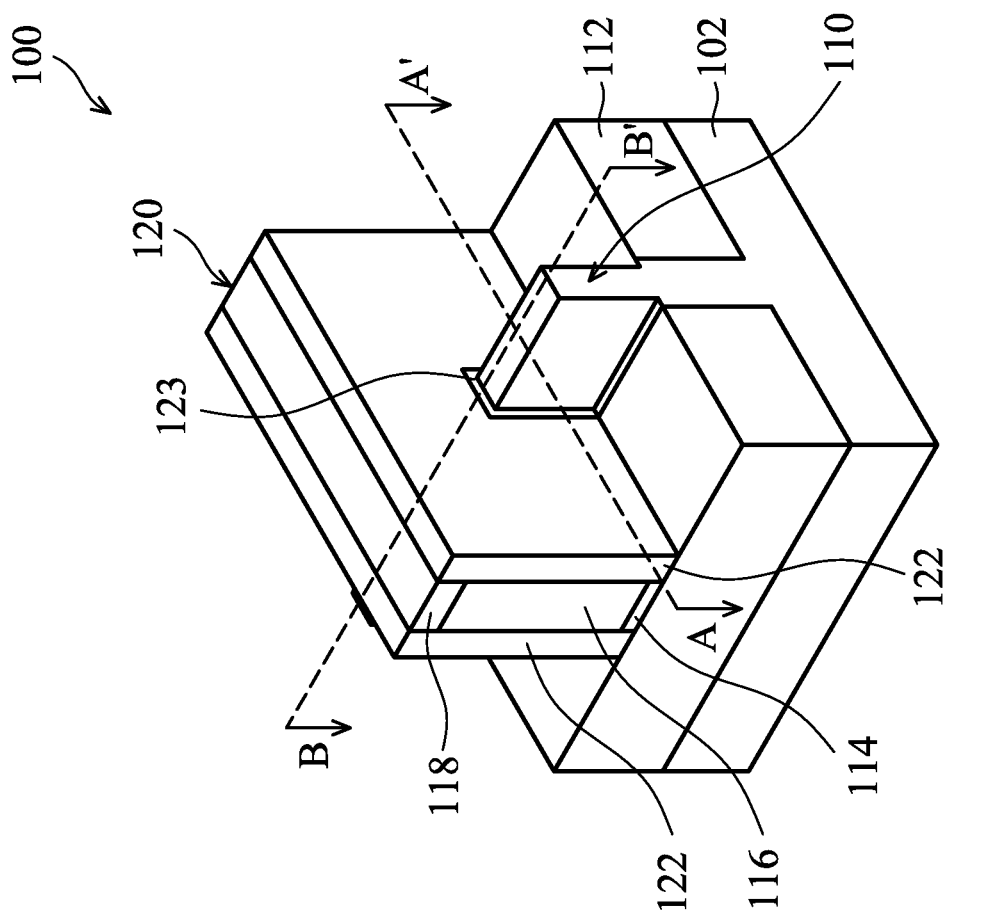

At operation 20, the method 10 (FIG. 1) removes the exterior layer 124 from the fin 110 in the S/D regions 110a (FIG. 5). In embodiments, the operation 20 may include a wet etching, reactive ion etching (RIE) in low density plasma, single-step etching at cryogenic conditions in inductively coupled plasma (ICP) combined with RIE, time-multiplexed deep silicon etching in ICP-RIE configuration reactor, single-step etching in high density plasma at room or near room temperature, or other suitable etching methods. In the illustrated embodiment, the selective wet etching process may include a diluted hydrofluoride (HF) or $NH_4OH$ etchant. The selective etching decreases the fin width $W_{fin}$ along the "x" direction and the fin height $H_{fin}$ along the "y" direction, exposing a portion of the fin 110 in the channel region 110b. The exposed surface of the fin 110 in the channel region 110b is denoted as the surface 123. The operations 18 and 20 can be regarded collectively as one trimming cycle 22.

Figure 6A:
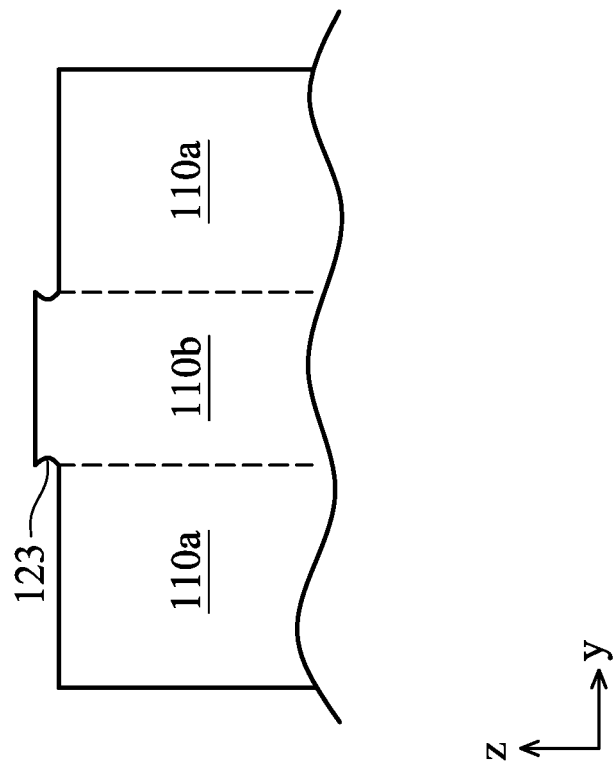
Figure 6B:
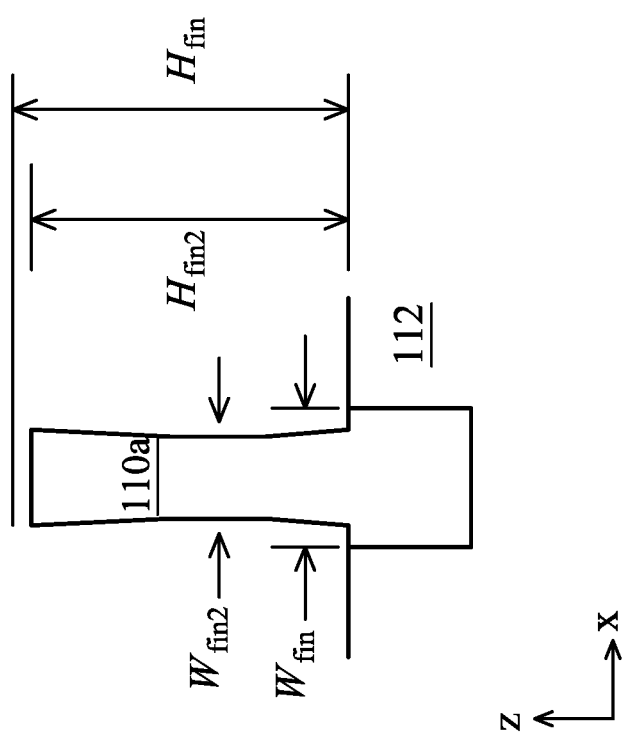

The device 100 post the operation 20 is shown in FIGS. 5, 6A, and 6B collectively. FIG. 6A is a cross-sectional view of the trimmed S/D regions 110a along the A-A' line of FIG. 5. FIG. 6B is a cross-sectional view of the fin 110 along the B-B' line of FIG. 5. Referring to FIG. 6A, the fin 110 in the S/D regions 110a is trimmed to have a new width $W_{fin2}$ that is smaller than $W_{fin}$. In some embodiments, as discussed above, the converted exterior layer 124 has a wider thickness around the center height of the fin 110 than around top and bottom of the fin 110. After the removing of the converted exterior layer 124, the sidewalls of the fin 110 curve in towards the center, as illustrated in the FIG. 6A. For clarity, the $W_{fin2}$ is measured at half height of the fin 110 ($H_{fin2}/2$). Similarly, the surface 123 of the exposed portion of the fin 110 in the channel region 110b may also curve in under the dummy gate stacked 120.

In embodiments, the reduction in the fin width after one trimming cycle 22 may be between 0.5 nm to 2 nm depending on the oxidation depth of the sidewall surfaces of the fin 110 in the operation 18. In the illustrated embodiment, the reduction in the fin width ($W_{fin}$-$W_{fin2}$) is about 1 nm or less. The height of the fin $H_{fin}$ is reduced to a new high $H_{fin2}$. In embodiments, the reduction in the fin height after one trimming cycle 22 may be between 0.5 nm to 2 nm depending on the oxidation depth of the top surface of the fin 110 in the operation 18. In the illustrated embodiment, the reduction in the fin height ($H_{fin}$-$H_{fin2}$) is substantially the same as the reduction in the fin width ($W_{fin}$-$W_{fin2}$). Therefore the top and sidewall surfaces of the fin 110 may be considered as shrinking conformally. Since the channel region 110b is covered by the dummy gate stack 120, it is not trimmed by this process. Referring to FIGS. 6A and 6B, as a result of the trimming cycle 22, the width of the S/D regions 104a ($W_{fin2}$) is now smaller than the width of the channel regions 104b ($W_{fin}$) and the height of the S/D regions 104a ($H_{fin2}$) is now smaller than the height ($H_{fin}$) of the channel regions 104b.

In embodiments, a desired fin width reduction ($W_{fin}$-$W_{fin2}$) may be larger than what one trimming cycle 22 can achieve. For example, a predetermined fin width reduction value D may be about 3 nm (e.g., to trim a 12 nm wide fin down to a 9 nm wide fin), while one trimming cycle 22 shrinks the fin width about 1 nm, which is smaller than the predetermined value D. At operation 24, the method 10 (FIG. 1) may repeat the trimming cycle 22 multiple times until the fin width reduction ($W_{fin}$-$W_{fin2}$) accumulatively achieve the predetermined value D. In the example above, the operation 24 may repeat the trimming cycle 22 extra two times to shrink an original 12 nm wide fin down to a 9 nm wide fin. If one trimming cycle is already sufficient, the method 10 proceeds to operation 26. This fin trimming process provides several benefits. First, it cleans the fin surfaces and creates more room for the subsequent epitaxial growth process, which enhances the quality of the subsequently epitaixally grown source/drain features. Second, the trimmed fin in the S/D regions exposes a portion of the fin in the channel region, which provides a directly contacting interface between the epitaxially grown source/drain features and the channel region. This provides a direct path for dopants to diffuse from S/D regions into channel region, thereby improving dopant diffusion efficiency. Third, the remaining fin portion in S/D regions maintains the strain strength in the channel region, compared with strain loss resulted from completely removing fin from S/D regions in some alternative processes.

FIGS. 7A, 7B, 7C, and 7D illustrate, in other alternative embodiments, a cross-sectional view of the S/D regions 110a along the A-A' line of FIG. 5 after one or more trimming cycles 22. In FIGS. 7A-7D, a bottom portion of the sidewalls of the fin 110 is covered by a liner film 126. The liner film 126 may include silicon nitride or aluminum oxide. In an embodiment, the liner film 126 includes an n-type dopant, such as phosphorous. In an embodiment, the liner film 126 is an n-type doped oxide layer, such as phosphosilicate glass (PSG). In another embodiment, the liner film 126 includes a p-type dopant, such as boron. In another embodiment, the liner film 126 is a p-type doped oxide layer, such as borosilicate glass (BSG). In various embodiments, the liner film 126 has a thickness of about 1 nm to about 5 nm. In an embodiment, the liner film 126 is first deposited as a blanket layer over the fin 110, then is covered by the dielectric material of the isolation structure 112 during the forming of the isolation structure 112, and later is recessed together with the isolation structure 112 by a recessing process to expose the top portion of the fin 110. Before the trimming cycles 22, the liner film 126 is embedded in the isolation structure 112 with the topmost portion of the liner film 126 substantially coplanar with the top surface of the isolation structure 112.

Figure 7B:
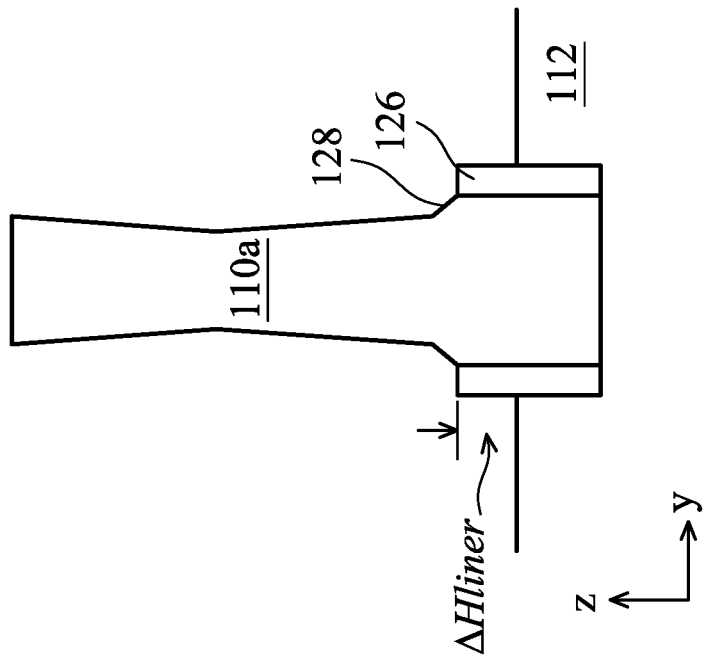
Figure 7A:
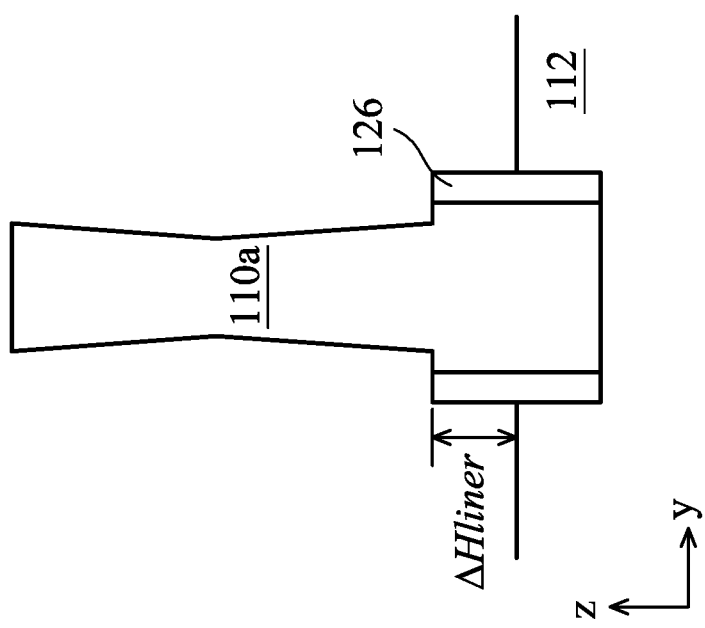

In one embodiment, as shown in FIG. 7A, the liner film 126 resists the selected etchant and substantially remains after the trimming cycles 22, while the isolation structure 112 suffers some top surface loss due to the selected etchant. In one embodiment, the isolation structure 112 includes semiconductor oxide, and the etching selectivity between the oxidized exterior layer 124 and the isolation structure 112 is less than 3:1. As a result, a bottom portion of the fin 110 covered by the liner film 126 is not reduced in width compared with its top portion, and the top surface of the isolation structure 112 is recessed to become lower than the liner film 126 by $\Delta H_{liner}$. As an example, $\Delta H_{liner}$ within a range from about 0.5 nm to about 6 nm.

In one embodiment, as shown in FIG. 7B, the liner film 126 also suffers some etching loss to the selected etchant, but has a smaller etching rate than the isolation structure 112. As a result, the liner film 126 is still higher than the top surface of the isolation structure 112 by $\Delta H_{liner}$, ranging from about 0.2 nm to about 5 nm. The sidewalls of the fin 110 in S/D regions 110a has a tilted surface 128 which interconnects the upper sidewall and bottom sidewall that are substantially perpendicular to the top surface of the isolation structure 112.

Figure 7C:
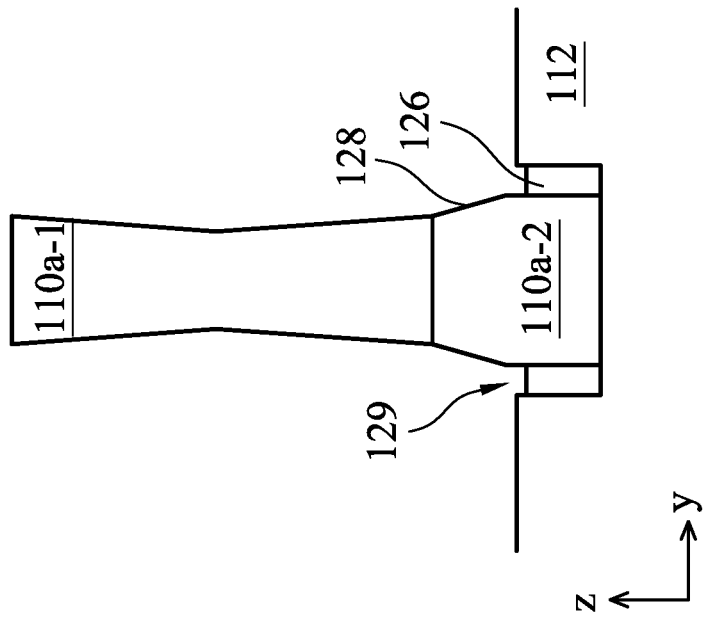
Figure 7D:
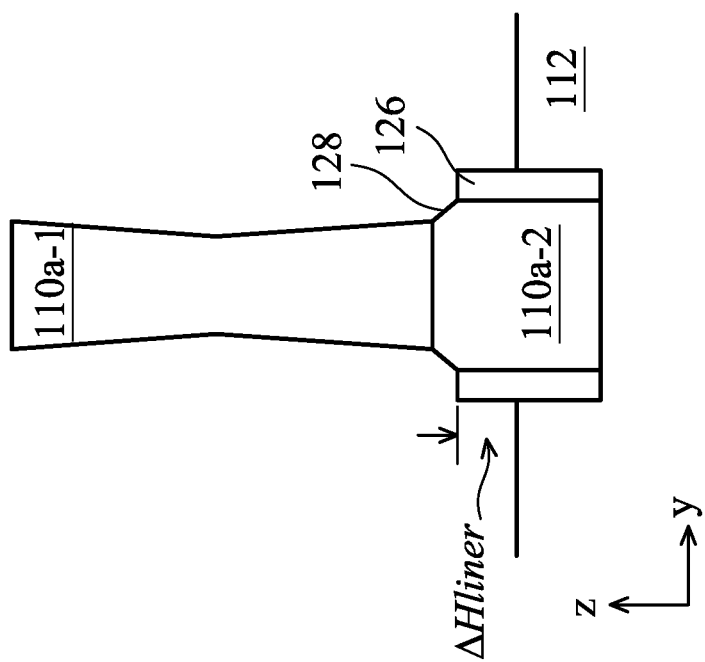
Figure 8:
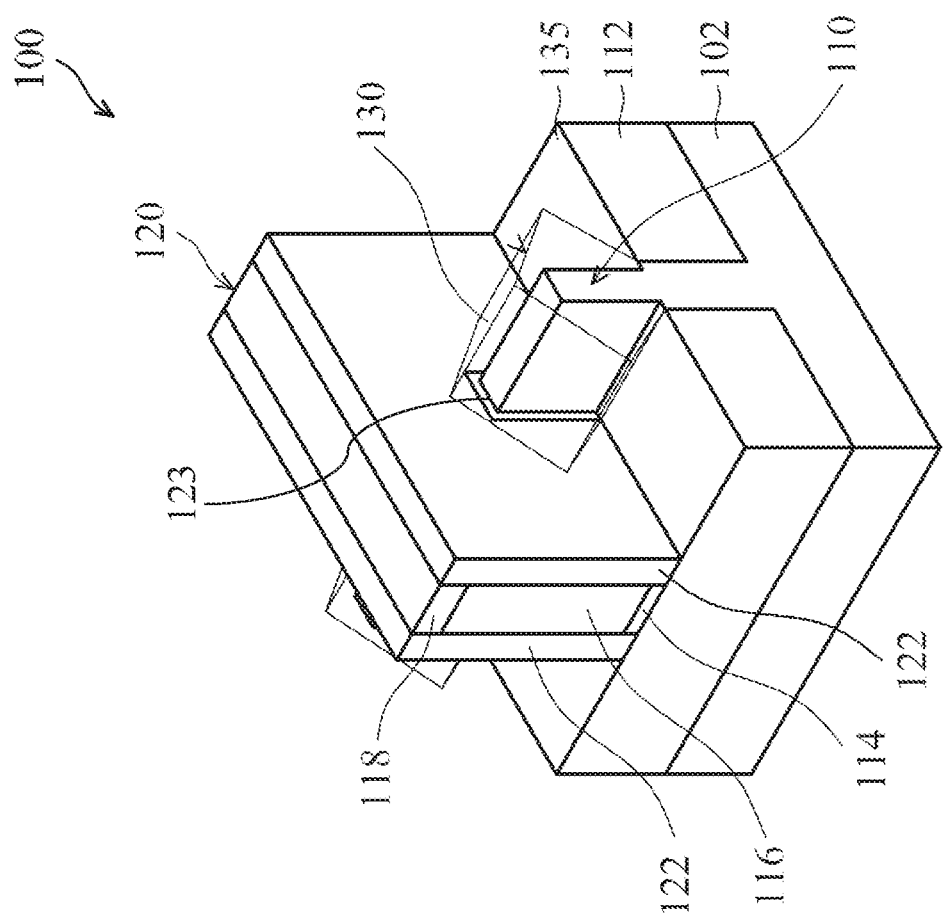

In one embodiment, as shown in FIG. 7C, the fin 110 has an upper portion 110a-1 and a bottom portion 110a-2 with different material compositions, such as SiGe in the upper portion 110a-1 and Si in the bottom portion 110a-2. After the trimming cycle 22, both the liner film 126 and the isolation structure 112 suffer etching loss, and part of the bottom portion of the fin 110 is exposed above the liner film 126 with a tilted surface 128 in sidewalls. The liner film 126 is above the top surface of the isolation structure 112 by $\Delta H_{liner}$, ranging from about 0.2 nm to about 5 nm. In one embodiment, as shown in FIG. 7D, the liner film 126 has a larger etching rate than the isolation structure 112. The recessed liner film 126 creates a dip 129 between the bottom portion of the fin 110 and the top surface of the isolation structure 112. The dip 129 may have a depth ranging from about 0.5 nm to about 2 nm. At operation 26, the method 10 (FIG. 1) perform an epitaxial growth process to form an epitaxial layer 130 above the fin 110 in the source/drain regions 110a as source/drain features. Therefore, the epitaxial layer 130 is also referred to as source/drain features 130. The dummy gate stack 120 and gate spacers 122 limit the source/drain features 130 to the source/drain regions. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 102. Since the trimmed fin 110 in the S/D regions 110a exposes portions of the fin 110 in the channel region 110b, the source/drain features 130 are in direct contact with the exposed portions of the fin 110 in the channel region 110b, which provides direct dopant diffusion path from the source/drain features 130 into the channel region 130b. Further, the source/drain features 130 may also extend into the channel region 110b due to the extra space spared by the curved-in surface 123 after the trimming cycles 22 (FIG. 6B). In another word, a portion of the source/drain features 130 may extend below the dummy gate stack 120.

The source/drain features 130 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 130 are not in-situ doped, an implantation process (i.e., a junction implant process) is performed to dope the source/drain features 130. In an exemplary embodiment, the source/drain features 130 in an NMOS device include SiP, while those in a PMOS device include GeSnB (tin may be used to tune the lattice constant) and/or SiGeSnB. One or more annealing processes may be performed to activate the source/drain features 130. In embodiments, an optional thermal treatment may be performed to enhance the dopant activation in the film 106, e.g. using rapid thermal annealing (RTA), millisecond anneal (MSA) or spike anneal, laser annealing (LSA), or other annealing techniques.

At operation 28, the method 10 (FIG. 1) replaces the dummy gate stack 120 with a final gate stack 120a using a gate-last process (also called a replacement gate process). However, when operation 14 forms a final gate stack instead of a dummy gate stack, operation 28 is bypassed. In embodiments, operation 28 involves multiple steps as discussed below with reference to FIGS. 9 and 10.

Figure 9:
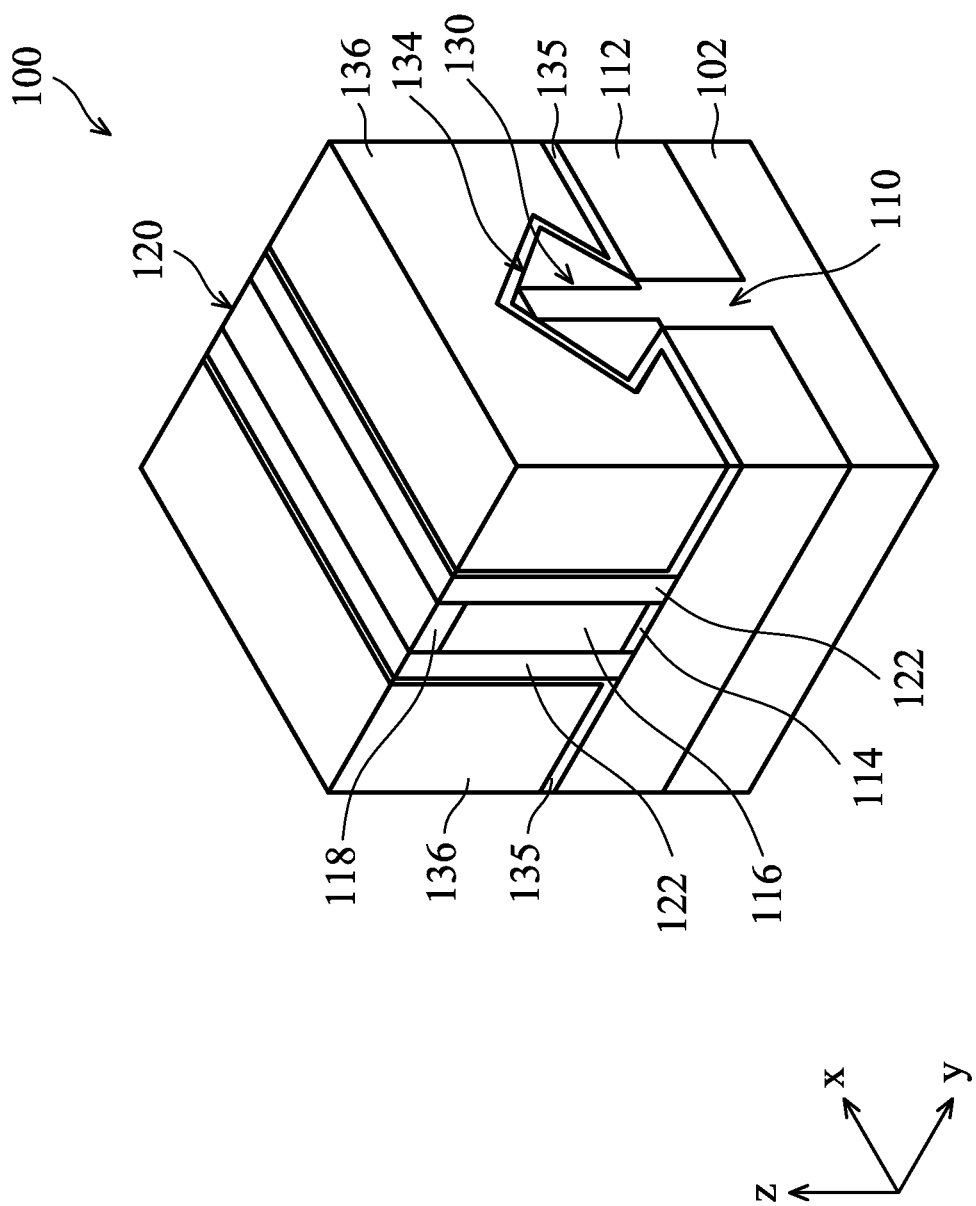

Referring to FIG. 9, in a first step, a contact etch stop (CES) layer 134 is formed to cover the device 100. In the illustrated embodiment, the CES layer 134 is deposited as a blanket layer over the gate stack 120, sidewalls of the gate spacer 122, the source/drain features 130, and over the top surface of the isolation structure 112. The CES layer 134 may include a dielectric material such as silicon nitride, silicon oxide, silicon oxynitride, silicon carbonitride, silicon carbon oxynitride, other dielectric materials, or combination thereof. The CES layer 134 may be formed by a plasma-enhanced CVD (PECVD) process and/or other suitable deposition or oxidation processes. Then a dielectric material layer 136 is deposited over the CES layer 134. The dielectric material layer 136 is also referred to as inter-layer dielectric (ILD) layer 136. The ILD layer 136 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 136 may be deposited by a PECVD process or other suitable deposition technique. In an embodiment, the ILD layer 136 is formed by a flowable CVD (FCVD) process. The FCVD process includes depositing a flowable material (such as a liquid compound) over the substrate 102 to fill various trenches, and converting the flowable material to a solid material by a suitable technique, such as thermal annealing or ultra-violet radiation. The ILD layer 136 is then etched back or planarized by a CMP process to expose the hard mask layer 118.

Figure 10:
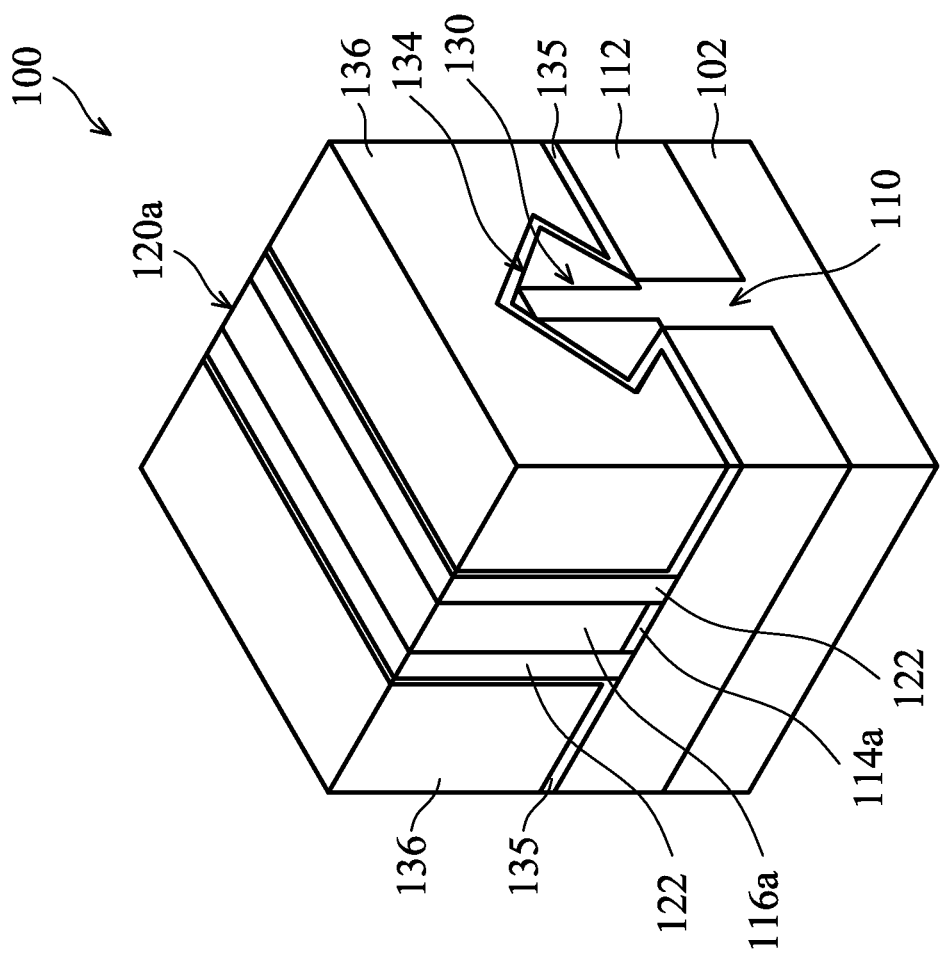

Referring to FIG. 10, in a subsequent step, the hard mask layer 118, the dummy electrode 116, and the dummy interfacial layer 114 are removed in one or more etching processes, thereby forming a recess between two sidewalls of the gate spacer 122. The various layers may be removed with a suitable wet etch, dry (plasma) etch, and/or other processes. Subsequently, one or more material layers are deposited into the recess to form the final gate stack 120a.

In an embodiment, the final gate stack 120a may include a high-k dielectric layer 114a and a conductive layer 116a thereon. The final gate stack 120a may further include an interfacial layer (e.g., $SiO_2$) (not shown) between the high-k dielectric layer 114a and the channel region 110b. The interfacial layer may be formed using chemical oxidation, thermal oxidation, ALD, CVD, and/or other suitable methods.

The high-k dielectric layer 114a may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 114a may be deposited using CVD, ALD and/or other suitable methods.

The conductive layer 116a may include one or more metal layers, such as work function metal layer(s), conductive barrier layer(s), and metal fill layer(s). The work function metal layer may be a p-type or an n-type work function layer depending on the type (p-type or n-type) of the transistor. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 116a may be deposited using methods such as CVD, PVD, plating, and/or other suitable processes.

At operation 30, the method 10 (FIG. 1) performs further steps to complete the fabrication of the device 100. For example, operation 30 may form a gate contact electrically connecting the gate stack 120a, and may form metal interconnects connecting the multi-gate FET to other portions of the device 100 to form a complete IC.

Although not intended to be limiting, one or more embodiments of the present disclosure provide many benefits to a semiconductor device and the formation thereof. For example, trimmed fin portions in the source/drain (S/D) regions allow source/drain features to directly contact the channel region, improving dopant diffusion efficiency. The trimming cycles also clean the exterior surfaces of the fin in the S/D regions, increasing epitaxial growth quality for the source/drain features. The fin portions remained in the S/D regions also help maintaining strain strength inside the channel region. Further, the disclosed methods can be readily integrated into existing semiconductor manufacturing processes.

In one exemplary aspect, the present disclosure is directed to a method. The method includes providing a structure having a substrate and a fin extending from the substrate, wherein the fin includes a first semiconductor material and has a source region, a channel region, and a drain region for a transistor; forming a gate stack over the channel region; performing a surface treatment to the fin in the source and drain regions, thereby converting an outer portion of the fin in the source and drain regions into a different material other than the first semiconductor material; etching the converted outer portion of the fin in the source and drain regions, thereby reducing a width of the fin in the source and drain regions; and depositing an epitaxial layer over the fin in the source and drain regions. In an embodiment, the performing of the surface treatment includes an oxidization process. In an embodiment, the oxidization process is a wet oxidization process. In an embodiment, the etching of the converted outer portion of the fin also reduces a height of the fin in the source and drain regions. In an embodiment, the etching of the converted outer portion of the fin also exposes a portion of the fin in the channel region, and wherein the epitaxial layer is in direct contact with the exposed portion of the fin in the channel region. In an embodiment, the structure further includes an isolation layer covering the substrate and the etching of the converted outer portion also recesses a top surface of the isolation layer. In an embodiment, a bottom portion of the fin is covered by a liner film, and wherein after the etching of the converted outer portion of the fin, a topmost portion of the liner film is higher than the recessed top surface of the isolation layer. In an embodiment, the first semiconductor material is silicon germanium. In an embodiment, the method further includes repeating the performing of the surface treatment and the etching of the converted outer portion of the fin until the width of the fin in the source and drain regions is reduced by a predetermined value. In an embodiment, the method, before the performing of the surface treatment, further includes forming a spacer over the gate stack and over the fin in the source and drain regions; and selectively etching the spacer over the fin in the source and drain regions.

In another exemplary aspect, the present disclosure is directed to a method of forming a field effect transistor (FET). The method includes providing a semiconductor substrate and a fin extending from the semiconductor substrate and through an isolation structure covering the semiconductor substrate, the fin including a first semiconductor material and having a source region, a channel region, and a drain region for the FET; forming a gate stack over the channel region; performing an oxidization process on top and sidewall surfaces of the fin in the source and drain regions; performing an etching process on the oxidized top and sidewall surfaces of the fin in the source and drain regions; repeating the performing of the oxidization process and the performing of the etching process until a width of the fin in the source and drain regions is reduced by a predetermined value; and epitaxially growing a material layer covering the fin in the source and drain regions. In an embodiment, the etching process includes wet etching. In an embodiment, the performing of the etching process also removes a top portion of the isolation structure. In an embodiment, a bottom portion of the fin is covered by a liner film, and wherein after the width of the fin in the source and drain regions is reduced by the predetermined value, a portion of the liner film is above the isolation structure. In an embodiment, the isolation structure is a shallow trench isolation (STI) feature. In an embodiment, a portion of the material layer extends below the gate stack.

In yet another exemplary aspect, the present disclosure is directed to a semiconductor device. The semiconductor device includes a substrate; a dielectric layer covering the substrate; a fin extending from the substrate and through the dielectric isolation layer, the fin including a first semiconductor material, the fin having a source/drain (S/D) region and a channel region, the S/D region providing a top surface and two sidewall surfaces, wherein a width of the S/D region is smaller than a width of the channel region; an epitaxial layer covering the S/D region; and a dielectric liner surrounding a bottom portion of the fin, wherein the dielectric liner has a lower portion below a top surface of the dielectric isolation layer and an upper portion above the top surface of the dielectric isolation layer. In an embodiment, a height of the S/D region is smaller than a height of the channel region. In an embodiment, a portion of the epitaxial layer extends into the channel region. In an embodiment, the first semiconductor material includes silicon germanium.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a semiconductor fin structure disposed over a substrate, the semiconductor fin structure having a channel region and a source/drain region, the channel region having a first width and the source/drain region having a second width that is less than the first width;
    a shallow trench isolation structure disposed on the substrate proximate the semiconductor fin structure, the shallow trench isolation structure having a sidewall facing the semiconductor fin structure; and
    a liner layer extending from the sidewall of the shallow trench isolation structure to a sidewall of the semiconductor fin structure.

2. The device of claim 1, further comprising:
    a gate structure disposed over the channel region of the semiconductor fin structure;
    a source/drain feature disposed over the source/drain region of the semiconductor fin structure.

3. The device of claim 2, wherein the source/drain feature extends into and physically contacts the channel region of the semiconductor fin structure.

4. The device of claim 3, wherein the source/drain feature includes an epitaxial material, and
    wherein the epitaxial material physically contacts the channel region of the semiconductor fin structure.

5. The device of claim 1, wherein the channel region of the semiconductor fin structure has a first height and the source/drain region of the semiconductor fin structure has a second height that is less than the first height.

6. The device of claim 1, wherein the source/drain region of the semiconductor fin structure has an upper portion, a middle portion and a lower portion, wherein the middle portion is disposed between the upper and lower portions, and wherein the upper portion is wider than the middle portion and the lower portion is wider than the middle portion.

7. The device of claim 1, wherein the liner layer has a top surface facing away from the substrate and the shallow trench isolation structure has a top surface facing away from the substrate, wherein the top surface of the liner layer extends to a first height and the top surface of the shallow trench isolation structure extends to a second height that is greater than the first height.

8. A device comprising:
    a semiconductor fin structure disposed over a substrate, the semiconductor fin structure having a channel region and a source/drain region, the source/drain region of the semiconductor fin structure including:
        a first portion having a first width;
        a second portion disposed over the first portion, the second portion having a second width that is different than the first width; and
        a third portion disposed over the second portion, the third portion having a third width that is different than the second width, wherein the channel region of the semiconductor fin structure has a fourth width that is greater than the first, second and third widths;

a gate structure disposed over the channel region of the semiconductor fin structure; and a source/drain feature disposed over the source/drain region of the semiconductor fin structure, wherein the source/drain feature extends under a portion of the gate structure and into the channel region of the semiconductor fin structure such that the source/drain feature physically contacts the channel region of the semiconductor fin structure.

9. The device of claim 8, wherein the gate structure includes a sidewall spacer and the source/drain feature extends under a portion of the sidewall spacer and into the channel region of the semiconductor fin structure.

10. The device of claim 8, wherein the second portion and the third portion of the source/drain region of the semiconductor fin structure are formed of the same material, and
wherein the first portion of the source/drain region of the semiconductor fin structure is formed of a different material than the second portion and the third portion of the source/drain region of the semiconductor fin structure.

11. The device of claim 8, further comprising:
a dielectric isolation structure disposed on the substrate proximate the semiconductor fin structure; and
a liner layer extending from the shallow trench isolation structure to a sidewall of the semiconductor fin structure.

12. The device of claim 11, wherein the liner layer has a top surface facing away from the substrate and the dielectric isolation structure has a top surface facing away from the substrate, wherein the top surface of the liner layer extends to a first height and the top surface of the shallow trench isolation structure extends to a second height that is greater than the first height.

13. The device of claim 11, wherein the liner layer has a top surface facing away from the substrate and the dielectric isolation structure has a top surface facing away from the substrate, wherein the top surface of the liner layer extends to a first height and the top surface of the shallow trench isolation structure extends to a second height that is less than the first height.

14. The device of claim 8, wherein the channel region of the semiconductor fin structure has a first height and the source/drain region of the semiconductor fin structure has a second height that is less than the first height.

15. A device comprising:
a dielectric isolation layer disposed on a substrate;
a fin extending from the substrate and through the dielectric isolation layer, the fin including a first semiconductor material, the fin having a source/drain (S/D) region and a channel region, wherein a width of the S/D region is smaller than a width of the channel region;
an epitaxial layer covering the S/D region; and
a dielectric liner surrounding a bottom portion of the fin, wherein the dielectric liner has a lower portion below a top surface of the dielectric isolation layer and an upper portion above the top surface of the dielectric isolation layer.

16. The device of claim 15, wherein a height of the S/D region is smaller than a height of the channel region.

17. The device of claim 15, wherein a portion of the epitaxial layer extends into the channel region.

18. The device of claim 15, wherein the first semiconductor material includes silicon germanium.

19. The device of claim 15, wherein the fin further includes a second semiconductor material that is different than the first semiconductor material.

20. The device of claim 15, wherein the dielectric liner includes a dopant such that that the dielectric line is a doped dielectric liner.

* * * * *